(12) United States Patent
Nakamura et al.

(10) Patent No.: US 6,422,928 B1
(45) Date of Patent: Jul. 23, 2002

(54) ABRASIVE MACHINE

(75) Inventors: Yoshio Nakamura; Kanji Fujii, both of Nagano (JP)

(73) Assignee: Fujikoshi Kikai Kogyo Kabushiki Kaisha, Nagano (JP)

(*) Notice: Subject to any disclaimer, the term of this patent is extended or adjusted under 35 U.S.C. 154(b) by 0 days.

(21) Appl. No.: 09/504,482

(22) Filed: Feb. 15, 2000

(30) Foreign Application Priority Data

Feb. 17, 1999 (JP) .......................................... 11-038814

(51) Int. Cl.[7] .................................................. B24B 7/22
(52) U.S. Cl. ......................................... 451/288; 451/388
(58) Field of Search ................................ 451/288, 287, 451/41, 398, 388

(56) References Cited

U.S. PATENT DOCUMENTS

| 5,441,444 A | | 8/1995 | Nakajima | 451/289 |
| 5,584,746 A | * | 12/1996 | Tanaka et al. | 451/41 |
| 5,681,215 A | * | 10/1997 | Sherwood et al. | 451/388 |
| 5,795,215 A | * | 8/1998 | Guthrie et al. | 451/288 |
| 6,024,630 A | * | 2/2000 | Shendon et al. | 451/41 |

FOREIGN PATENT DOCUMENTS

| JP | 6445566 | 2/1989 |
| JP | 4013567 | 1/1992 |
| JP | 10337655 | 12/1998 |

* cited by examiner

Primary Examiner—Robert A. Rose
(74) Attorney, Agent, or Firm—Jordan and Hamburg LLP

(57) ABSTRACT

An abrasive machine is capable of solving the liquation of metal ions, and improving abrading accuracy. In the abrasive machine, an abrasive plate has an abrasive face capable of abrading a wafer. A holding section includes: a head member located above the abrasive face; a holding plate provided between the head member and the abrasive face, the holding plate having a holding face capable of holding the wafer; and a bellows fixed between the holding plate and the head member, the bellows allowing the holding plate to move close to and away from and incline with respect to the head member, the bellows forming a pressure chamber. Pressing means presses the wafer onto the abrasive face, with the holding plate, by pressurizing the pressure chamber. The bellows is made by cutting a block of plastic without forming seams.

16 Claims, 3 Drawing Sheets

ABRASIVE MACHINE

BACKGROUND OF THE INVENTION

The present invention relates to an abrasive machine, more precisely relates to an abrasive machine having: a holding section for holding a wafer on a lower face; an abrasive plate having an abrasive face for abrading the wafer; and a driving mechanism for relatively moving the abrading plate with respect to the wafer.

These days, semiconductor devices are highly integrated, so flatness of silicon wafers, which will be substrates of semiconductor devices, must be highly improved. To precisely abrade layers and wires on a wafer, the surface of the wafer must be highly flat. Thus, machines for abrading wafers are required to highly precisely abrade surfaces of wafers and layers, etc. formed on the surfaces thereof. Besides wafers of semiconductor devices, high accuracy of abrading wafer-shaped work pieces is required in other fields.

Some conventional abrading machines have air bags, which are provided to the holding sections so as to uniformly press whole wafer faces onto the abrasive faces.

An example of the holding section 55 is shown in FIG. 4.

A head member 12 has a concave section 14 in a lower face thereof.

A holding plate 16 is provided in the concave section 14 of the head member 12, and a lower face is a holding face for holding a wafer 20.

A metallic bellows 56 is fixed between the holding plate 16 and the head member 12. The metallic bellows 56 allows the holding plate 16 to move close to and away from and incline with respect to the lower face of the head member 12. The metallic bellows 56 forms a pressure chamber 26.

In the holding section 55 having the above described members, the pressure chamber 26 is pressurized by supplying a pressurized fluid from pressurizing means (not shown) so as to press the wafer 20, with the holding plate 16, onto the abrasive face 50 of the abrasive plate 52.

The abrasive plate 52 is relatively moved with respect to the holding section 16 with the wafer 20 by a driving mechanism, so that the surface of the wafer 20 can be abraded by the abrasive face 50.

By employing the metallic bellows 56 in the holding section 55, the wafer 20 can be pressed onto the abrasive face 50 by pressing force, which is uniformly applied. And, the metallic bellows 56 can follow inclination and minute vertical movement of the abrasive face 50, therefore abrading accuracy of the abrasive machine can be improved. Further, the metallic bellows 56 can stand against external force, which is applied sideward, by its own rigidity.

However, the metallic bellows 56 is made by piling a plurality of donut-shaped plates and mutually welding their inner edges and outer edges. Therefore, it is difficult to uniformly welding their edges, so the wafer 20, which is held by the holding plate 16, cannot be uniformly pressed onto the abrasive face 52. And, the rigidity of the metallic bellows 56 is very high, so it cannot follow very minute change of pressure and motion. Further, the metallic bellows 56 causes liquation of metal ions, which must be avoided in the steps of manufacturing semiconductor devices.

To solve the above described disadvantages, as shown in FIG. 5, a holding section 60 includes an elastic member 62, which is, for example, a rubber plate, being fixed between the holding plate 16 and the head member 12 so as to form a pressure chamber 26, which allows the holding plate 16 to move close to and away from and incline with respect to a lower face of the head member 12.

The holding section 60 will be explained with reference to FIG. 5.

The abrasive plate 52 can be revolved on its own axis, and an abrasive cloth 51 is adhered on the abrasive plate 52 so as to form the abrasive face 50. The holding section 60, which is capable of revolving and vertically moving, is located above the abrasive face 50. The holding section 60 includes: a head member 12 having a concave section, which is opened in a lower face thereof; a holding plate 16 having a lower face capable of holding the wafer 20; the elastic member 62, whose outer circumferential part 62a is fixed to an inner bottom face of the head member 12 and whose inner circumferential part 62b is fixed to an upper face of the holding plate 16, suspending the holding plate 16 so as to allow very minute vertical and horizontal motion thereof; and the pressure chamber 26 being formed by dividing an inner space of the head member 12 with the holding plate 16 and the plate-shaped elastic member 62. A fluid supplying means (not shown) is communicated to the pressure chamber 26, so that pressurized fluid can be supplied into the pressure chamber 26. An O-ring 64 is made of, for example, rubber. The O-ring 64 is provided between the outer circumferential face of the holding plate 16 and the inner circumferential face of the concave section 14 of the head member 12, and it is capable of absorbing relative motion, e.g., rotation, swing motion, of the holding plate 16 with respect to the head member 12.

In the conventional abrasive machine, the elastic member 62, which is the rubber plate, makes the surface 20a of the wafer 20, which is adhered on the holding plate 16 by water, quickly follow minute inclination and minute vertical movement of the abrasive face 50 as the air bag. Even if the surface 20a follows the abrasive face 50, the whole surface 20a can be uniformly pressed onto the abrasive face 50. With this action, the whole surface 20a can be highly uniformly abraded like a mirror. Further, the disadvantage of the liquation of the metal ions can be solved.

Note that, in the holding section 60 shown in FIG. 6, the wafer 20 is adhered onto the holding plate 16 by water, so a backing sheet, whose surface has high adsorptivity, is adhered on the surface of the holding plate 16 so as to securely adhere the wafer 20 thereonto.

However, in the conventional abrasive machine, the holding plate 16 is suspended by one plate-shaped elastic member 62, so the whole surface of the holding plate cannot uniformly move, in the vertical direction, with enough stroke. Therefore, the holding plate 16 cannot fully follow the inclination and the vertical movement of the abrasive face 50, so that the whole surface 20a of the wafer cannot be uniformly pressed onto the abrasive face 50. Namely, the holding plate 16 does not have enough vertical stroke, so it can quickly follow the very minute movement of the abrasive face 50 but cannot follow when some conditions are changed. Especially, this disadvantage is serious in the case of precisely abrade large-sized wafers.

To solve this problem, using a rubber bellows instead of the elastic member 62 was proposed. But the elasticity of the rubber bellows is too high, so the rubber is irregularly deformed, and it is difficult to uniformly press the wafer 20 onto the abrasive face 50. Then, a rubber bellows reinforced by piano wires, etc. was used, but the rubber bellows cannot uniformly move because of the reinforcing member, so it is difficult to quickly and uniformly press the wafer 20 onto the abrasive face 50. It is also difficult to make the rubber bellows including the reinforcing members.

SUMMARY OF THE INVENTION

An object of the present invention is to provide an abrasive machine, which is capable of solving the liquation of metal ions, making a holding plate, which holds a wafer on a lower face, quickly follow very minute movement of an abrasive face of an abrasive plate, uniformly pressing the whole surface of the wafer onto the abrasive face, and improving abrading accuracy.

To achieve the object, the abrasive machine of the present invention comprises:

an abrasive plate having an upper face, which is an abrasive face capable of abrading a wafer;

a holding section including:
   a head member being located above the abrasive face with a prescribed separation;
   a holding plate being provided between the head member and the abrasive face, the holding plate having a lower face, which is a holding face capable of holding the wafer; and
   a bellows being fixed between the holding plate and the head member, the bellows allowing the holding plate to move close to and away from and incline with respect to a lower face of the head member, the bellows forming a pressure chamber;

means for pressing the wafer onto the abrasive face, with the holding plate, by pressurizing the pressure chamber; and a driving mechanism for relatively moving the abrasive plate with respect to the wafer held by the holding section so as to abrade the wafer by the abrasive face, wherein the bellows is made by cutting a block of plastic without forming seams.

With this structure, no liquation of the metal ions is occurred; the holding plate, which holds the wafer on the lower face, can quickly follow the very minute movement of the abrasive face of the abrasive plate; the whole surface of the wafer can be uniformly pressed onto the abrasive face; and the abrading accuracy can be improved.

In the abrasive machine, the plastic may be ultra-high-molecular weight-polyethylene. With this structure, the bellows can have enough rigidity and can be easily made by cutting the plastic block In the abrasive machine, the head member may have a concave section, which is opened in the lower face thereof, and the holding plate may be provided in the concave section of the head member, whereby an outer circumferential face of the holding plate contacts an inner circumferential face of the concave section so as to limit swing motion of the holding plate with respect to the head member. With this structure, the abrading accuracy can be improved.

In the abrasive machine, one of the outer circumferential face of the holding plate and the inner circumferential face of the concave section may be a convex face. With this structure, friction between the circumferential faces can be reduced, and the holding plate can be smoothly inclined or moved in the vertical direction.

The abrasive machine may further comprise:
means for reducing pressure in the pressure chamber;
a first tapered section being formed in the inner face of the concave section of the head member; and
a second tapered section being formed in the holding plate, the second tapered section being drawn and fitting with the first tapered section when the pressure in the pressure chamber is reduced,
wherein one of the first and second tapered sections are a male tapered section, and the other is a female tapered section. With this structure, the holding plate can be properly positioned, and the wafer can be precisely attached and detached.

In the abrasive machine, the holding face of the holding plate may be capable of sucking and holding the wafer by reducing pressure, or holding the wafer with water. With this structure too, the holding plate can be properly positioned, and the wafer can be precisely attached and detached.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

Figure 1:
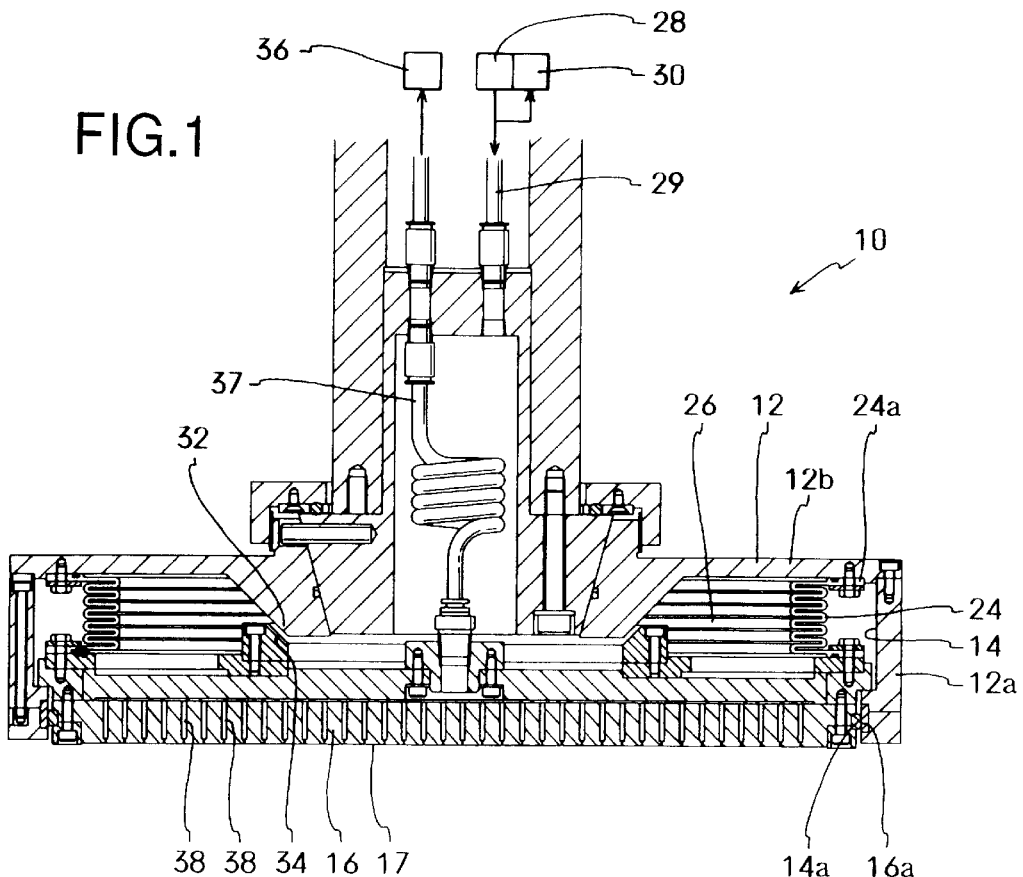
FIG. 1 is a partial sectional view of an abrasive machine of the present invention.
Figure 2:
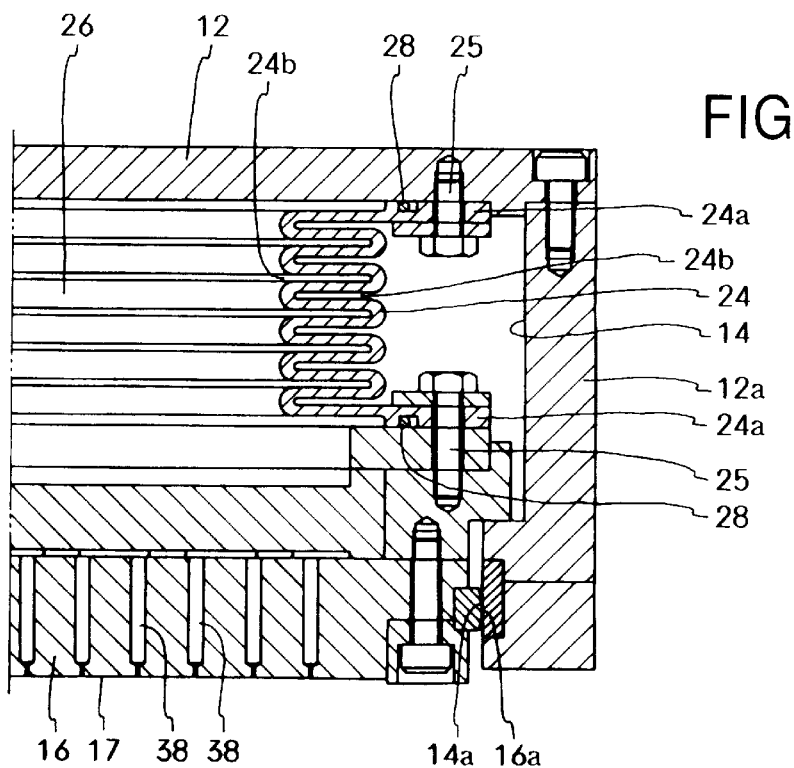
FIG. 2 is a sectional view of a main part of the abrasive machine shown in FIG. 1.
Figure 3:
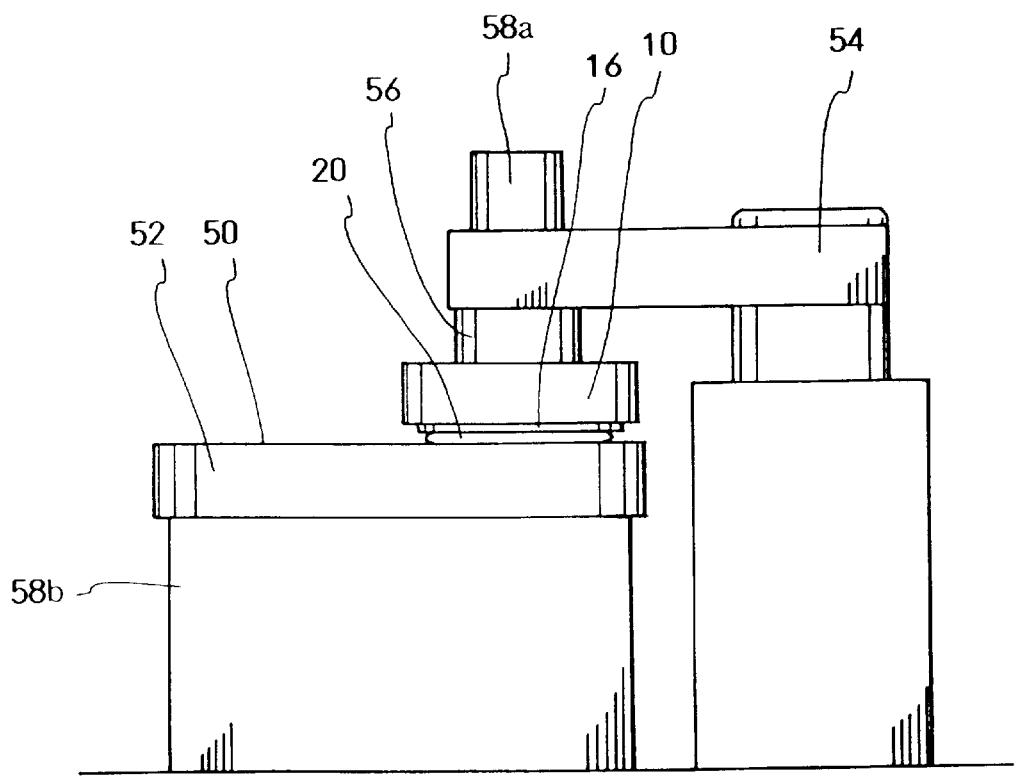
FIG. 3 is a side view of the abrasive machine.

FIG. 1 is a partial sectional view of an abrasive machine of the present invention, and FIG. 2 is a sectional view of a main part of the abrasive machine shown in FIG. 1. And, FIG. 3 is a side view of the abrasive machine.

A head member 12 constitutes a base section of a holding section 10, which holds a work piece, e.g., a wafer 20. A concave section 14 is formed in the head member 12 and opened in a lower face of the head member 12. The head member 12 is located above an abrasive face 50 of an abrasive plate 52 (see FIG. 3) with a prescribed separation.

Note that, the head member 12 has a cylindrical section 12a and a plate section 12b, which are connected by bolts. The constituting members including the bolts are made of, for example, stainless steel and coated with resin, e.g., Teflon (trademark), so as to prevent liquation of metal ions.

A holding plate 16 is provided between the head member 12 and the abrasive face 52, and its lower face is a holding face 17 for holding the wafer 20. The holding plate 16 is accommodated in the concave section 14 of the head member 12.

In the present embodiment, the holding face 17 of the holding plate 16 is capable of sucking the wafer 20 by reducing pressure. A vacuum unit 36 is communicated with a plurality of sucking holes 38, which are formed in the holding plate 16, by a communicating tube 37. By using the vacuum unit 36, air is sucked into the holes 38, so that the wafer 20 can be sucked and held onto the holding face 17.

Note that, there is formed a step section at an outer edge of the holding plate 16, and the step section is engaged with a step section of the cylindrical section 12a. With this structure, a downward movement of the holding plate 16 can be limited.

A bellows 24 is fixed between the holding plate 16 and the head member 12, and it allows the holding plate 16 to move close to and away from the lower face of the head member 12 and incline with respect thereto. Further, the bellows 24 forms a pressure chamber 26.

The bellows 24 is made, in one piece, by cutting a block of plastic without forming seams. The bellows 24 is wholly uniformly formed, so that it can be extended, contracted and inclined smoothly.

When pressurized fluid is introduced into the pressure chamber 26, the pressure therein can be uniformly applied to the whole face of the holding plate 16. And the whole face of the wafer 20 can be pressed onto the abrasive face 50 with the holding plate 16. By the shape of the bellows 24, a vertical stroke of the bellows can be made fully long. Thus, the holding plate 16 holding the wafer 20 can quickly and smoothly follow very minute movement, e.g., vertical movement, inclination, of the abrasive face 50, so that the whole face of the wafer 20 can be uniformly pressed onto the abrasive face 50. Therefore, accuracy of abrading the wafer can be improved.

The bellows 24 is made of a plastic, so the problem of the ion liquation can be solved.

The plastic for forming the bellows 24 may be, for example, ultra-high-molecular weight-polyethylene. The ultra-high-molecular weight-polyethylene has enough rigidity, durability and chemical-resisting property.

Besides the ultra-high-molecular weight-polyethylene, Teflon (trademark), polyacetal, PVC (polyvinyl chloride), polypropylene, polyethylene, etc. may be employed as the plastic material of the bellows.

The bellows 24 may be formed by an NC lathe. For example, the plastic block is a cylindrical plastic block, and circular grooves or slits are alternately formed in an outer and inner circumferential faces of the cylindrical plastic block. The bellows 24 can be precisely and easily formed. Unlike rubber, the ultra-high-molecular weight-polyethylene has enough hardness, so it can be easily cut.

Diameter of the bellows 24 is almost equal to that of the wafer 20. Thus, the pressure applied to the holding plate 16 can be applied to the whole face of the wafer 20, so that the whole face of the wafer 20 can be uniformly pressed with the holding plate 16.

The pressure chamber 26 is formed by the inner bottom face of the head member 12, the upper face of the holding plate 16 and the bellows 24. The pressurized fluid, e.g., compressed air, is introduced into the pressure chamber 26 by a pressurizing unit 28. When the pressure chamber 26 is pressurized by the unit 28, the wafer 20 can be pressed onto the abrasive face 50 of the abrasive plate 52 (see FIG. 3) with the holding plate 16. The pressure chamber 26 is communicated to a pressure reducing unit 30, so the holding plate 16 is drawn toward the inner bottom face of the head member 12 when the pressure in the pressure chamber 26 is reduced by the unit 30.

A tube 29 connects pressurizing means (not shown), e.g., a compressor, of the unit 28 with the pressure chamber 26, and it is branched so as to connect pressure reducing means (not shown), e.g., a vacuum unit, to the pressure chamber 26.

A regulator (not shown) for adjusting the pressure of the compressed air introduced into the pressure chamber 26 may be provided to the unit 28. Another regulator (not shown) for adjusting degree of reducing the pressure in the pressure chamber 26 may be provided to the unit 30.

A first tapered section 32 is formed in the inner face, e.g., the inner bottom face, of the head member 12. The first tapered section 32 is projected downward as a male tapered section.

A second tapered section 34 is formed in the upper face of the holding plate 16. When the pressure in the pressure chamber 26 is reduced by the unit 30, the second tapered section 34 is drawn and moved upward, then fitted with the first tapered section 32. Namely, the second tapered section 34 is a bored as a female tapered section.

The shapes of the first and second tapered sections 32 and 34 are not limited to those of the present embodiment. For example, a female tapered section may be formed in the cylindrical section 12a, and a male tapered section may be formed on an outer circumferential edge of the holding plate 16. In these case too, the holding plate 16 can be correctly positioned in the holding section 10.

In the present embodiment, one first tapered section 32 is coaxially formed in the head member 12, and one second tapered section 34 is coaxially formed in the holding plate 16. The present invention is not limited to these structures, the first and the second tapered sections 32 and 34 may be shifted from the centers, and a plurality of sets of them may be formed.

A mechanism for restraining a swing motion of the holding plate 16 will be explained.

In the present embodiment, the head member 12 has the concave section 14, which is opened in the lower face thereof, the holding plate 16 is provided in the concave section 14 of the head member 12, and an outer circumferential 16a face of the holding plate 16 contacts an inner circumferential face 14a of the concave section 14 so as to limit the swing motion of the holding plate 16 with respect to the head member 12.

One of the outer circumferential face 16a of the holding plate 16 and the inner circumferential face 14a of the concave section 14 is a convex face. In the present embodiment, the outer circumferential face 16a of the holding plate 16 is the convex face. By forming the convex face, which is projected sideward and whose surface is curved, friction between the circumferential faces can be reduced, and the holding plate 16 can be smoothly moved in the vertical direction and inclined with respect to the head member 12.

With above described structure, the swing motion of the holding plate 16 holding the wafer 20 can be properly limited, and the friction can be reduced. Thus, the holding plate 16 can quickly and well follow the very minute inclination and vertical movement of the abrasive face 50, so that the whole face of the wafer 20 can be uniformly pressed onto the abrasive face 50. Therefore, accuracy of abrading the wafer can be improved.

By employing the mechanism for restraining the swing motion of the holding plate 16, the swing motion, which is caused by an external force working to the holding section 10 from a side and which makes a part of the holding plate is moved downward and the other part thereof is moved upward, can be prevented. Since the external force from the side can be properly absorbed, the holding plate 16 and the abrasive face 50 can be maintained parallel, so that uniform load can be always applied to the wafer 20. Therefore, the surface of the wafer 20 can be highly precisely abraded.

Note that, in the present embodiment, the outer circumferential face 16a of the holding plate 16 and the inner circumferential face 14a of the concave section 14 are made of slippery plastics. Namely, a plastic ring is fitted on the outer circumferential face of the holding plate 16; another plastic ring, which receives and guides the plait ring, is attached on the inner face of the head member 12.

The basic structure of the abrasive machine including the above described holding section 10 will be explained with reference to FIG. 3.

Figure 4:
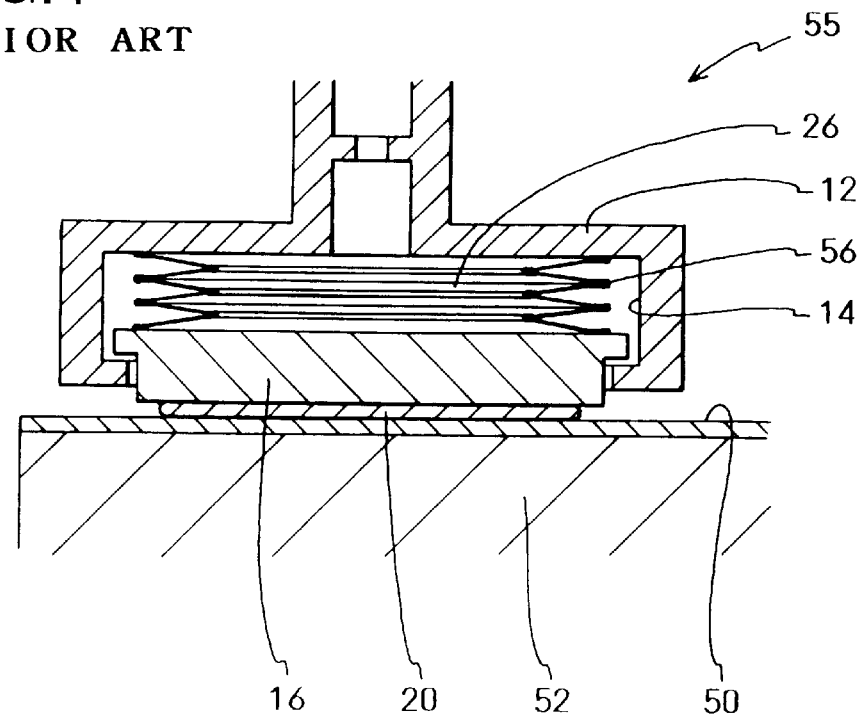
FIG. 4 is a sectional view of the conventional abrasive machine.
Figure 5:
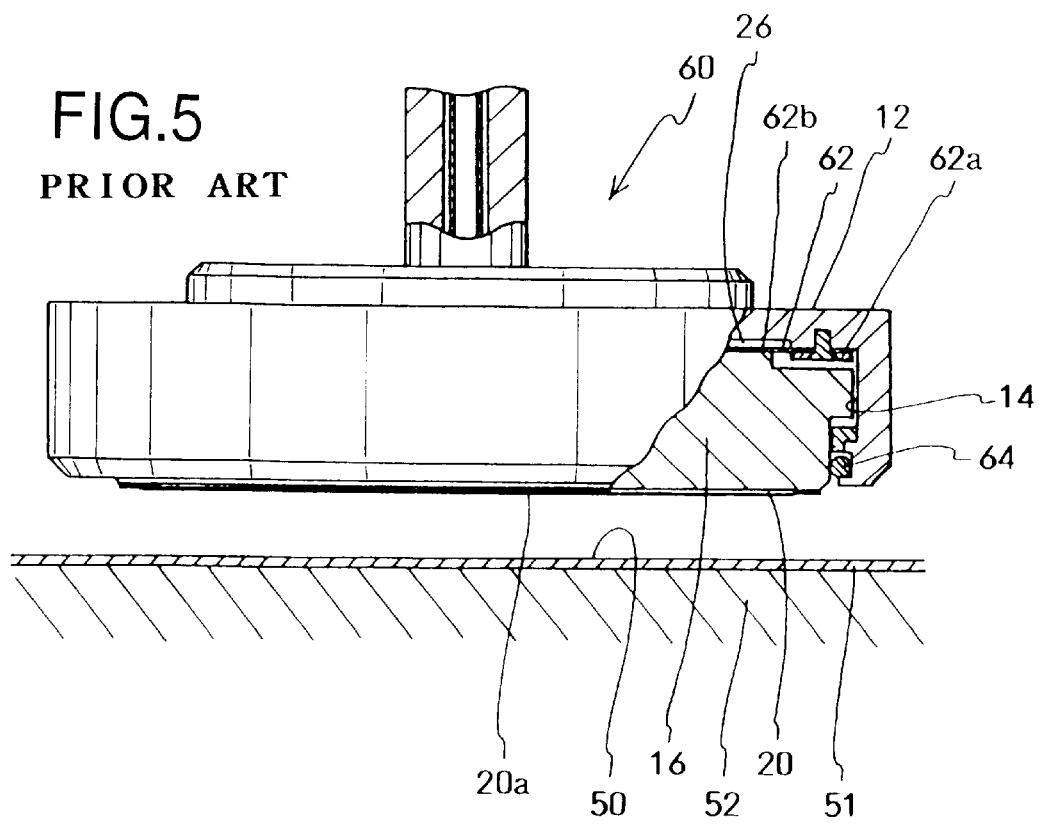
FIG. 5 is a partial sectional view of conventional abrasive machine.

The abrasive machine comprises: the abrasive plate 52 having the abrasive face 50 (see FIGS. 4 and 5); a mechanism 54 for moving the holding section 10 close to and away from abrasive plate 52 so as to contact the surface of the wafer 20 onto the abrasive face 50; a mechanism 56, e.g., the air bag including the pressurizing unit 28, for pressing the wafer 20 with the holding plate 16; driving mechanisms 58a and 58b for relatively moving (rotation and/or reciprocative linear motion) the holding section 10 holding the wafer 20, which has been pressed onto the abrasive face 50, with respect to the abrasive plate 52; and a mechanism (not shown) for supplying an abrasive agent including slurry.

Next, the action of the abrasive machine will be explained.

Firstly, the reducing unit 30 reduces the pressure in the pressure chamber 26 to suck and move the holding plate 16 upward. With this action, the second (female) tapered section 34 fitted with the first (male) tapered section 32, so that the holding plate 16 can be correctly positioned in the holding section 10.

Even if an axis of the head member 12 is slightly shifted with respect to that of the holding plate 16, the shift can be corrected while fitting the tapered sections 32 and 34, so that the axis of the holding plate 16 can be correctly positioned. By fitting the tapered sections 32 and 34 each other, the swing motion of the holding plate 16 can be perfectly prevented. Therefore, the holding plate 16 can be positioned with higher positioning accuracy.

The holding section 10 is moved to a position, at which the wafer 20 has been correctly positioned, then the wafer 20 is sucked onto the holding face 17 of the holding plate 16.

Next, the holding section 10 is moved to a position above the abrasive face 50 of the abrasive plate 52 so as to face the wafer 20 thereto. Then, the compressed air is supplied into the pressure chamber 26 by the unit 28 so as to press the holding plate 16 onto the abrasive face 50. Even if the wafer 20, which has been held by the holding plate 16, is slightly inclined with respect to the abrasive face 50, the whole face of the holding plate 16 can be uniformly pressed by the compressed air, so that the surface of the wafer 20 can follow the abrasive face 50 and it can be abraded uniformly. By employing the bellows 24 of the present embodiment, the wafer can be abraded with very high abrading accuracy as described above.

Note that, by changing the pressure in the pressure chamber with the regulator, abrading conditions can be changed.

In the above-described embodiment, the wafer 20 is held by air suction. The present invention is not limited to this manner, the wafer 20 may be adhered on the holding face 17 of the holding plate 16 by water. In this case, a backing member is generally adhered on the holding face 17. A surface of the backing member has enough adsorption, and the wafer 20 can be adhered thereon by surface tension and viscosity of a liquid, e.g., water. In the case of adhering the wafer 20 on the holding face 17 by water, a known template is adhered on the holding face 17 of the holding plate 16 so as to prevent a shift of the wafer 20.

In the above described embodiment, the holding plate 16 and the wafer 20 are pressed onto the abrasive face 50 by the compressed air, but other fluids, e.g., water, oil, may be employed as the pressurized fluid.

The abrasive machine is capable of abrading not only the silicon wafers but also wafer-shaped work pieces, e.g., glass, crystal, can be abraded properly.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An abrasive machine, comprising:
   an abrasive plate having an upper face, which is an abrasive face capable of abrading a wafer;
   a holding section including:
      a head member being located above the abrasive face with a prescribed separation;
      a holding plate being provided between said head member and the abrasive face, said holding plate having a lower face, which is a holding face capable of holding the wafer; and
      a bellows being fixed between said holding plate and said head member, said bellows allowing said holding plate to move close to and away from and incline with respect to a lower face of said head member, said bellows forming a pressure chamber;
   means for pressing the wafer onto the abrasive face, with said holding plate, by pressurizing the pressure chamber; and
   a driving mechanism for relatively moving said abrasive plate with respect to the wafer held by said holding section so as to abrade the wafer by the abrasive face,
   wherein said bellows is made by cutting a block of plastic without forming seams and said plastic is ultra-high molecular weight polyethylene.

2. The abrasive machine according to claim 1,
   wherein said head member has a concave section, which is opened in the lower face thereof, and
   said holding plate is provided in the concave section of said head member, whereby an outer circumferential face of said holding plate contacts an inner circumferential face of the concave section so as to limit swing motion of said holding plate with respect to said head member.

3. The abrasive machine according to claim 1,
   wherein one of the outer circumferential face of said holding plate and the inner circumferential face of the concave section is a convex face.

4. The abrasive machine according to claim 1,
   further comprising:
      means for reducing pressure in the pressure chamber;
      a first tapered section being formed in the inner face of the concave section of said head member; and
      a second tapered section being formed in said holding plate, said second tapered section being drawn and fitting with said first tapered section when the pressure in the pressure chamber is reduced,
      wherein one of said first and second tapered sections are a male tapered section, and the other is a female tapered section.

5. The abrasive machine according to claim 1, wherein the holding face of said holding plate is capable of holding the wafer by applying vacuum pressure.

6. The abrasive machine according to claim 1,
   wherein the holding face of said holding plate is capable of holding the wafer with water.

7. The abrasive machine according to claim 1, wherein the bellows is formed by cutting notches in an outer face and an inner face of the block of plastic.

8. An abrasive machine having an abrasive plate having an upper face, which is an abrasive face capable of abrading a wafer comprising:
  a holding section including:
    a head member being located above the abrasive face with a prescribed separation,
    a holding plate being provided between said head member and the abrasive face, said holding plate having a lower face, which is a holding face capable of holding the wafer; and
    a plastic bellows being fixed between said holding plate and said head member, said bellows allowing said holding plate to move relative to said head member, said bellows forming a pressure chamber; and
  means for communicating a pressure control device, wherein said plastic is ultra-high molecular weight polyethylene. of plastic.

9. The abrasive machine according to claim 8, wherein the plastic bellows is formed without seams.

10. The abrasive machine according to claim 8, wherein the plastic bellows is formed by cutting a block of plastic.

11. The abrasive machine according to claim 8, wherein said head member has a concave section, which is opened in a lower face thereof, and
  said holding plate is provided in the concave section of said head member, whereby an outer circumferential face of said holding plate contacts an inner circumferential face of the concave section so as to limit swing motion of said holding plate with respect to said head member.

12. The abrasive machine according to claim 11, wherein one of the outer circumferential face of said holding plate and the inner circumferential face of the concave section is a convex face.

13. The abrasive machine according to claim 12, further comprising:
  a first tapered section being formed in the inner face of the concave section of said head member; and
  a second tapered section being formed in said holding plate, said second tapered section being drawn to and fitting with said first tapered section when the pressure in the pressure chamber is reduced,
  wherein one of said first and second tapered sections are a male tapered section, and the another one is a female tapered section.

14. The abrasive machine according to claim 8, wherein the holding face of said holding plate is capable of holding the wafer by applying vacuum pressure.

15. The abrasive machine according to claim 8, wherein the holding face of said holding plate is capable of holding the wafer with water.

16. An abrasive machine having an abrasive plate having an upper face, which is an abrasive face capable of abrading a wafer comprising:
  a holding section including:
    a head member being located above the abrasive face with a prescribed separation;
    a holding plate being provided between said head member and the abrasive face, said holding plate having a lower face, which is a holding face capable of holding the wafer; and
    a plastic bellows being fixed between said holding plate and said head member, said bellows allowing said holding plate to move relative to said head member, said bellows forming a pressure chamber; and
  means for communicating a pressure control device, wherein the plastic bellows is formed by cutting notches in an outer face and an inner face of a block of plastic.

* * * * *